US011682746B2

(12) United States Patent
Dykaar

(10) Patent No.: US 11,682,746 B2
(45) Date of Patent: Jun. 20, 2023

(54) ARRAYS OF LIGHT EMITTERS AND METHODS OF FORMING THEREOF

(71) Applicant: DIFTEK LASERS, INC., Waterloo (CA)

(72) Inventor: Douglas R. Dykaar, Waterloo (CA)

(73) Assignee: DIFTEK LASERS, INC., Waterloo (CA)

( * ) Notice: Subject to any disclaimer, the term of this patent is extended or adjusted under 35 U.S.C. 154(b) by 221 days.

(21) Appl. No.: 17/036,172

(22) Filed: Sep. 29, 2020

(65) Prior Publication Data

US 2021/0098648 A1   Apr. 1, 2021

Related U.S. Application Data

(60) Provisional application No. 62/907,743, filed on Sep. 30, 2019.

(51) Int. Cl.

| H01L 33/06 | (2010.01) |
| H01L 33/00 | (2010.01) |
| H01L 33/20 | (2010.01) |
| H05K 1/09  | (2006.01) |
| H01L 21/02 | (2006.01) |

(52) U.S. Cl.
CPC ............ *H01L 33/06* (2013.01); *H01L 33/005* (2013.01); *H01L 33/20* (2013.01); *H05K 1/09* (2013.01); *H01L 21/02293* (2013.01); *H05K 2201/10106* (2013.01); *H05K 2203/1338* (2013.01)

(58) Field of Classification Search
CPC . H01L 33/06; H01L 33/005; H01L 21/02293; H01L 33/20; H05K 1/09; H05K 2203/1338
See application file for complete search history.

(56) References Cited

U.S. PATENT DOCUMENTS

| 9,184,235 B2* | 11/2015 | Brandt | H01L 33/06 |
| 2014/0217361 A1* | 8/2014 | Seong | H01L 33/04 |
| | | | 438/34 |
| 2016/0013366 A1* | 1/2016 | Hwang | H01L 33/08 |
| | | | 257/13 |
| 2017/0323925 A1* | 11/2017 | Schneider, Jr. | H01L 33/007 |

OTHER PUBLICATIONS

Emission color control from blue to red with nanocolumn diameter of InGaN/GaN nanocolumn arrays grown on same substrate—Hiroto Sekiguchi, Katsumi Kishino and Akihiko Kikuchi—2010 American Institute of Physics, Applied Physics Letters 96, 231104.

* cited by examiner

*Primary Examiner* — David Vu
*Assistant Examiner* — Brandon C Fox
(74) *Attorney, Agent, or Firm* — Nyssa Inc.

(57) ABSTRACT

There are provided methods of growing arrays of light emitters on substrates. An example method includes adjusting a growth parameter of a given light emitter of an array of light emitters on a substrate to obtain an adjusted growth parameter. The adjusting may be based on a location of the given light emitter on the substrate. The adjusting may be to compensate for nonuniformity in a growth profile of the light emitters across the substrate. The nonuniformity may be associated with a corresponding nonuniformity among wavelengths of light generated by the light emitters. Adjusting the growth parameter may be to adjust the corresponding nonuniformity. The method may also include growing the given light emitter on the substrate based on the adjusted growth parameter. Arrays of corresponding light emitters are also described.

14 Claims, 12 Drawing Sheets

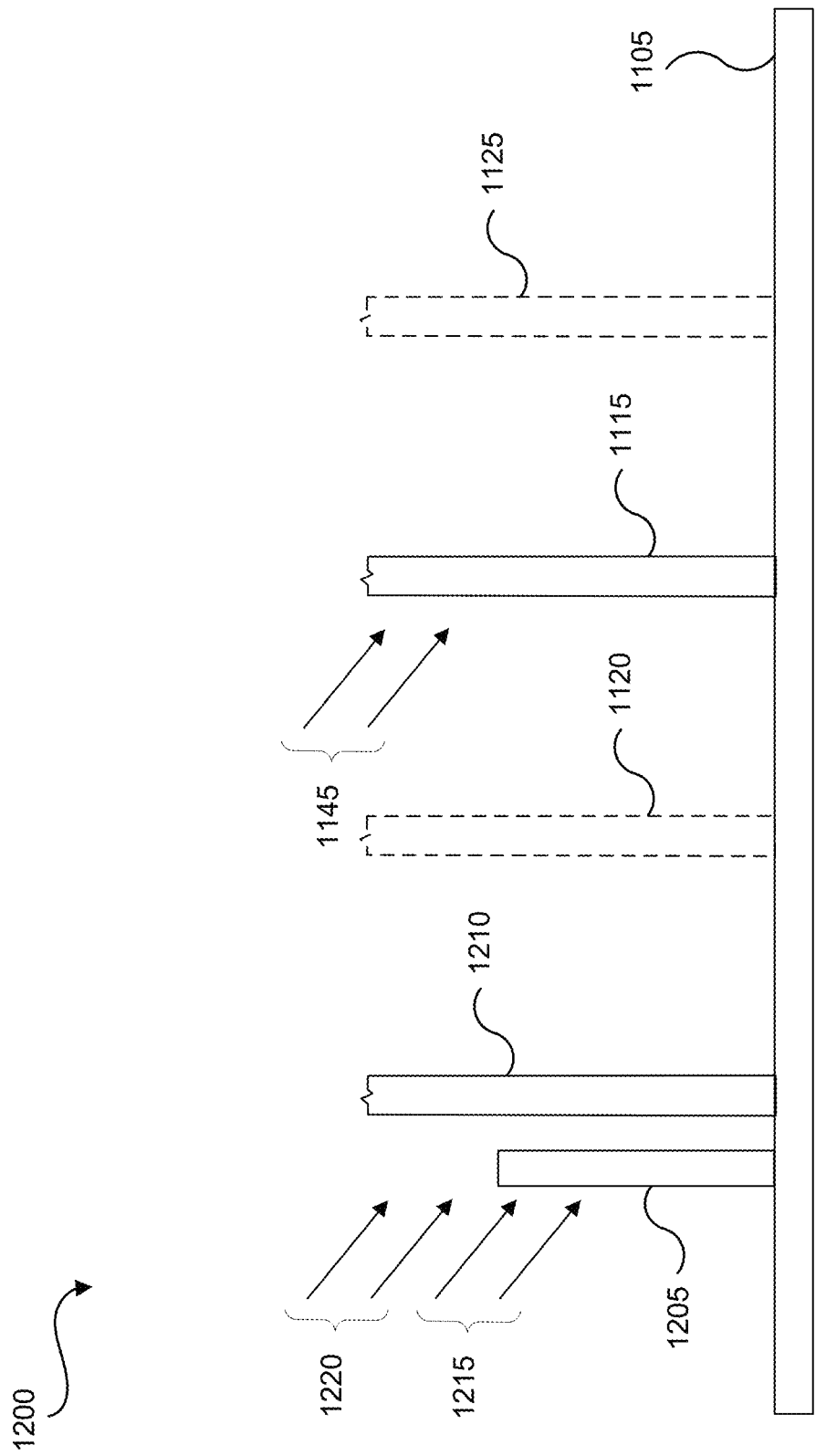

ARRAYS OF LIGHT EMITTERS AND METHODS OF FORMING THEREOF

CROSS-REFERENCE TO RELATED APPLICATION

This application claims priority from U.S. Provisional Patent Application No. 62/907,743, filed on Sep. 30, 2019, which is incorporated herein by reference in its entirety.

FIELD

The present specification relates to light emitters, and in particular to arrays of light emitters on a substrate.

BACKGROUND

Optical devices may use or manipulate light. This light may be generated by a light source. The operational parameters of the optical devices may impose requirements on the characteristics of the light generated by the light source.

SUMMARY

According to an implementation of the present specification there is provided a method of growing an array of light emitters on a substrate, the method comprising: adjusting a growth parameter of a given light emitter of the array of the light emitters to obtain an adjusted growth parameter, the adjusting based on a location of the given light emitter on the substrate, the adjusting to compensate for nonuniformity in a growth profile of the light emitters across the substrate, the nonuniformity associated with a corresponding nonuniformity among wavelengths of light generated by the light emitters, the adjusting the growth parameter to adjust the corresponding nonuniformity; and growing the given light emitter on the substrate based on the adjusted growth parameter.

The method may further comprise: before the adjusting the growth parameter: obtaining the growth profile of the light emitters across the substrate; and determining the nonuniformity in the growth profile across the substrate.

The light emitters may comprise solid-state light emitters each comprising a corresponding quantum well to emit light.

One or more of the light emitters may comprise a nanorod or a nanowall.

The growth parameter may comprise one or more of a size, shape, and composition of the given light emitter.

The given light emitter may comprise a nanorod; and the growth parameter may comprise a diameter of the nanorod.

The adjusting the growth parameter may comprise adjusting a corresponding diameter of an opening in a mask; and the growing the nanorod may comprise depositing the nanorod on the substrate through the opening in the mask.

The growth parameter may comprise a composition of the given light emitter; the growing the given light emitter may comprise depositing the given light emitter on the substrate; and the adjusting the growth parameter may comprise forming a structure on the substrate proximate the given light emitter to at last partially shadow the depositing the given light emitter to adjust the composition of the given light emitter.

The growing the given light emitter may comprise depositing the given light emitter on the substrate using one or more of molecular beam epitaxy (MBE), chemical vapor deposition (CVD), and liquid phase epitaxy (LPE).

The adjusting the growth parameter may be to reduce the corresponding nonuniformity.

According to another implementation of the present specification there is provided a device comprising: a substrate; an array of light emitters grown on the substrate, the array comprising: a first light emitter located at a first location on the substrate and having a first parameter, the first light emitter to emit a first light having a first wavelength, the first parameter associated with the first wavelength; and a second light emitter located at a second location on the substrate and having a second parameter, the second light emitter to emit a second light having a second wavelength, the second parameter associated with the second wavelength; and the first parameter being different from the second parameter to compensate for nonuniformity in a growth profile of the light emitters across the substrate, the nonuniformity associated with a corresponding nonuniformity between the first wavelength and the second wavelength, the first parameter and the second parameter selected to reduce the corresponding nonuniformity.

The light emitters may each comprise a solid-state light emitter having a quantum well to emit light.

One or more of the light emitters may comprise a nanorod or a nanowall.

The first parameter and the second parameter may each comprise one or more of a size, shape, and composition of the first light emitter and the second light emitter respectively.

The first light emitter may comprise a first nanorod and the second light emitter may comprise a second nanorod; and the first parameter may comprise a diameter of the first nanorod and the second parameter may comprise a corresponding diameter of the second nanorod.

The first parameter may comprise a first composition of the first light emitter and the second parameter may comprise a second composition of the second light emitter; and the device may further comprise a structure on the substrate proximate the first light emitter to at last partially shadow depositing the first light emitter on the substrate to adjust the first composition of the first light emitter relative to the second composition of the second light emitter.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

FIG. 12 shows a schematic side elevation view of an example array of example light emitters being grown on an example substrate, in accordance with a non-limiting implementation of the present specification.

DETAILED DESCRIPTION

Figure 1:
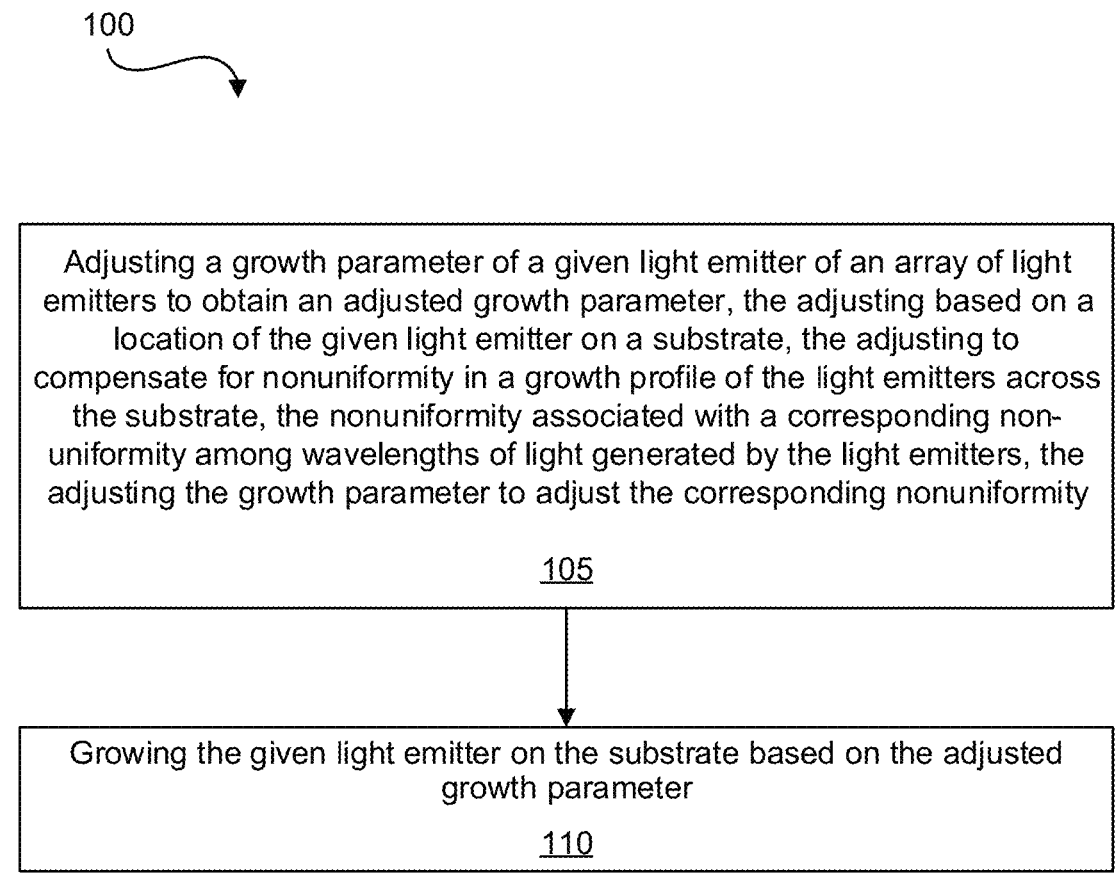
FIG. 1 shows a flowchart an example method of growing an array of light emitters on a substrate, in accordance with a non-limiting implementation of the present specification.

In the following description, certain specific details are set forth in order to provide a thorough understanding of various disclosed implementations. However, one skilled in the relevant art will recognize that implementations may be practiced without one or more of these specific details, or with other methods, components, materials, and the like.

Moreover, in the following description, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, ZZ, and the like). Similar logic can be applied for two or more items in any occurrence of "at least one . . . " and "one or more . . . " language.

Unless the context requires otherwise, throughout the specification and claims which follow, the word "comprise" and variations thereof, such as, "comprises" and "comprising" are to be construed in an open, inclusive sense, that is as "including, but not limited to."

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the implementations.

Some light sources may comprise a single light emitter, while other light sources may comprise a plurality or array of light emitters. In some examples, such an array of light emitters may be grown or otherwise formed on a substrate. When an array of light emitters are used to emit corresponding lights which are then combined to form an operating light beam for an optical device, the quality of the operating light beam may depend on the quality of the lights generated by each emitter. For example, the quality of the operating light beam may depend on the differences between the light generated by a given light emitter compared to the lights generated by the other light emitters.

Some optical devices require an operating light beam that has a relatively narrow wavelength range. Adjusting the light emitters in an array to each emit light that is close to or the same as the light emitted by the other emitters in the array may assist in obtaining an operating light beam with a relatively narrow wavelength range.

In some examples, the light emitters may comprise solid-state light emitters grown on a substrate. Moreover, in some examples, these solid-state light emitters may comprise semiconductor materials. In semiconductor growth by techniques such as Molecular Beam Epitaxy (MBE), or Metal-Organic Chemical Vapor Deposition (MOCVD), active layers are grown on a III-V semiconductor wafer, such as GaAs, InP, or GaN and processed into lasers or Light Emitting Diodes (LEDs). As the active region is formed by one or more Quantum Wells (QWs), the sensitivity of the emission wavelength to small variations across a substrate may be plus or minus several nm or more. For applications requiring specific wavelengths with small tolerances, this results in low yield. External structures that restrict the operating wavelength add cost and complexity and may result in low output power if the peak emission wavelength of the QW(s) is too far from the externally allowed emission wavelength.

FIG. 1 shows a flowchart of an example method 100, which may be used to grow an array of light emitters on a substrate. At box 105, a growth parameter of a given light emitter of the array of light emitters may be adjusted to obtain an adjusted growth parameter. The adjustments described in relation to the given light emitter, or similar adjustments, may also be applied in relation to two or more of the light emitters of the array. In some examples, similar adjustments may be applied in relation to a plurality of, or all of, the light emitters of the array of light emitters. In addition, it is contemplated that in some examples, more than one growth parameter may be adjusted during the growth of the light emitters.

In some examples, growth parameter may refer to a parameter in relation to the size, shape, composition, or other attribute of the light emitters. Moreover, in some examples, growth parameter may refer to an environmental condition or parameter present during the growth or formation of the light emitters. Examples of such environmental conditions or parameters may include temperature, deposition or growth rates, vacuum levels during deposition or growth, substrate composition, substrate surface treatments, and the like. Furthermore, it is contemplated that in some examples, growth parameters may also include pre-treatment or preprocessing applied to the substrate before the growth of the light emitters commences, or a posttreatment or postprocessing applied to the array of the grown light emitters.

The adjusting of the growth parameter may be based on the location of the given light emitter on the substrate. In other words, how a given growth parameter is adjusted, or the choice of which growth parameter is chosen to be adjusted, may be determined based on the location of the given light emitter on the substrate. As such, the growth parameters of different light emitters located at different locations on the substrate may be adjusted differently based on their different locations.

This adjusting of the growth parameter may be used to compensate for nonuniformity in a growth profile of the light emitters across the substrate. The growth profile may be a reflection of the differences between the light emitters on the substrate based on the different locations of those light emitters on the substrate. Such differences may arise because the growth conditions may be different across the substrate. For example, there may be differences across the substrate in growth conditions such as the rate of deposition of the light emitters, dopant flux, temperatures, and the like. Some examples of nonuniform growth profiles are described in greater detail in relation to FIGS. 3 and 9.

In some examples, this nonuniformity in the growth profile is associated with a corresponding nonuniformity among wavelengths of light generated by the light emitters. This corresponding nonuniformity among the wavelengths may also be referred to as "wavelength nonuniformity". For example, different sizes, shapes, dopant or other constituent material distributions, or compositions among the light emitters may cause such wavelength nonuniformity. The adjusting of the growth parameter described in relation to box 105 of method 100 may be used to adjust this wavelength nonuniformity.

In some examples, this adjusting of the wavelength nonuniformity may comprise reducing the wavelength nonuniformity. In other words, the growth parameters of the light emitters may be adjusted to compensate for nonuniformities in the growth profile of the light emitters across the substrate such that any wavelength nonuniformity associated with the growth profile nonuniformity may be reduced or eliminated. This reduction in wavelength nonuniformity, in turn, may allow for the light generated by the various light emitters to be combined together to form an operating light beam that has a narrower wavelength range. Such an operating light beam with a relatively narrow wavelength range may find application in optical devices that use monochrome or otherwise narrow wavelength range operating light beams. Examples of such optical devices may include optical displays, optical sensing devices, and the like.

The above discussion describes adjusting growth parameters to "compensate" for nonuniformity in a growth profile. It is contemplated that in some examples, such compensation need not fully reverse or counteract the wavelength nonuniformity caused by the growth profile nonuniformity. In such examples, adjusting the growth parameters may partially compensate for or otherwise partially counteract the wavelength nonuniformity caused by the nonuniformity in the growth profile.

At box 110 of method 100, the given light emitter may be grown on the substrate based on the adjusted growth parameter. It is also contemplated that multiple, or all of, the light emitters may be grown on the substrate based on corresponding adjusted growth parameters. In some examples, the growing the given light emitter may comprise depositing the given light emitter on the substrate using one or more of molecular beam epitaxy (MBE), chemical vapor deposition (CVD), and liquid phase epitaxy (LPE). It is contemplated that in some examples other methods of growing or depositing light emitters on the substrate may also be used.

In some examples, method 100 may further comprise obtaining the growth profile before adjusting the growth parameter. In some such examples, before adjusting the growth parameter, the growth profile of the light emitters across the substrate may be obtained. In some examples, to obtain the growth profile, the array of the light emitters may be grown on the substrate and then the growth profile may be measured. For example, if the light emitters are grown on the substrate such that there is variability in the sizes or shapes of the light emitters across the substrate, measurements or other inspections may be made to determine such variability. Similarly, if the light emitters are grown the substrate such that there is variability in the compositions of the light emitters across the substrate, measurements may be made of the compositions of the light emitters across the substrate to obtain the growth profile.

It is also contemplated that in some examples, the growth profile of given processes or devices used for growing the light emitters may already be known. In such examples the growth profile need not be measured, and may simply be retrieved or otherwise obtained. Once the growth profile is obtained, the nonuniformity of the growth profile across the substrate may be determined. The growth profile nonuniformity may then be used in determining how the growth parameters of the light emitters are to be adjusted to compensate for nonuniformity in the growth profile.

In addition, it is contemplated that in some examples, the light emitters may comprise solid-state light emitters. Moreover, in some examples, these solid-state light emitters may each comprise a quantum well to emit light. It is also contemplated that in some examples one or more of the light emitters may each comprise two or more quantum wells. Furthermore, in some examples, the light emitters may comprise a nanorod, a nanowall, and the like. Some examples of nanorod light emitter arrays are described in relation to FIGS. 2-7 and 11-12. Moreover, some examples of nanowall light emitter arrays are described in relation to FIGS. 8-10. In some examples, the growth parameter may comprise one or more of the size, shape, and composition of the given light emitter. As described above, in some examples other growth parameters may also be used.

In some examples where the light emitter comprises a nanorod, the growth parameter may comprise a diameter of the nanorod. Moreover, in some examples, the diameter of a nanorod may be related to the wavelength of light emitted by that nanorod. For example, a smaller diameter may give rise to tighter quantum confinement within a quantum well in the nanorod, thereby decreasing the wavelength of the light emitted by that quantum well in the nanorod. As such, controlling the diameter of the nanorod may be used to control the wavelength of the light emitted by the nanorod.

In some examples, the nanorod may be grown on the substrate by using a mask with openings through which the nanorod may be deposited on the substrate. These openings may have corresponding diameters. Adjusting the growth parameter, for example the nanorod diameter, may comprise adjusting the diameter of the openings in the mask. The nanorods, then, may be grown by depositing the nanorods on the substrate through the openings in the mask.

It is contemplated that in some examples, other methods of controlling the diameter of the nanorods may also be used. Some examples of these other methods may include patterning or seeding the substrate to control the position or diameter of the nanorods, and the like. It is also contemplated that in some examples, attributes or parameters of nanorods other than, or in addition to, their diameter may also be adjusted. Examples of such other attributes or parameters may include length, cross-sectional shape, composition, constituent material distribution, crystal structure, and the like.

In examples where light emitters comprise nanowalls, the width or thickness of the nanowall may be correlated with the degree of quantum confinement in the quantum wells in the wall, and consequently with the wavelength of the light emitted by the quantum wells in the nanowalls. In such examples, the thickness of the nanowall may be the growth parameter adjusted in order to adjust the wavelength of the light emitted by the nanowall light emitter. Similar to nanorods, it is contemplated that in some examples, growth parameters other than, or in addition to, the wall thickness may also be used to adjust the wavelength of light emitted by the nanowalls.

In addition, in some examples, the growth parameter may comprise the composition of the light emitter. In such examples, growing the light emitter may comprise depositing the light emitter on the substrate. Adjusting the growth parameter may comprise forming a structure on the substrate proximate the light emitter to at least partially shadow depositing the light emitter to adjust the composition of the light emitter. Such a structure may act as a physical barrier against material or energy flows that may impact the growth of the given light emitter. Examples of material flows may include flows of dopants or other constituent materials used to grow the light emitter. Moreover, examples of energy flows may include heat, light, or other forms of energy which may be used to control the growth of the light emitter.

In some examples, the shadowing structure may be grown, deposited, or otherwise formed on the substrate using a method similar to the methods used to grow the light emitters. Moreover, in some examples, the shadowing structure may be formed on the substrate using a method different than those used for forming the light emitters. Furthermore, in some examples, the shadowing structure may be formed on the substrate prior to growing the light emitters on the substrate. An example of a shadowing structure is described in relation to FIG. 12.

Figure 2:
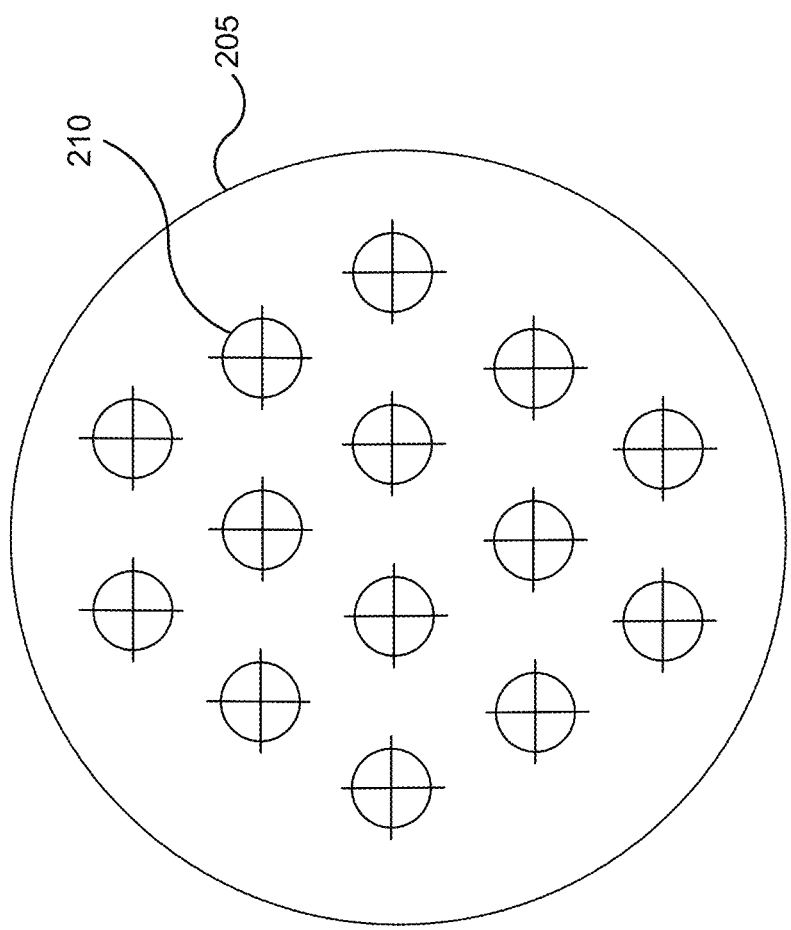
FIG. 2 shows a schematic top plan view of an example substrate for an array of light emitters, in accordance with a non-limiting implementation of the present specification.

Turning now to FIG. 2, a schematic top plan view is shown of an example substrate 205 for an array of light emitters. Position markers 210 show the locations of light emitter such as nanorods on substrate 205. In some examples, substrate 205 may comprise a semiconductor material. Moreover, in some examples, the substrate may comprise a silicon wafer. It is also contemplated that in some examples, the substrate may comprise a material other than a silicon wafer, or other than a semiconductor.

In addition, while in FIG. 2 substrate 205 is shown as having a circular shape, it is contemplated that in some examples, the substrate shape may be other than circular. Moreover, while FIG. 2 shows fourteen position markers 210 on substrate 205, it is contemplated that in some examples a different number of light emitters may be grown on substrate 205, or that the locations or the distribution of the light emitters on substrate 205 may be different than those shown in FIG. 2.

Figure 3:
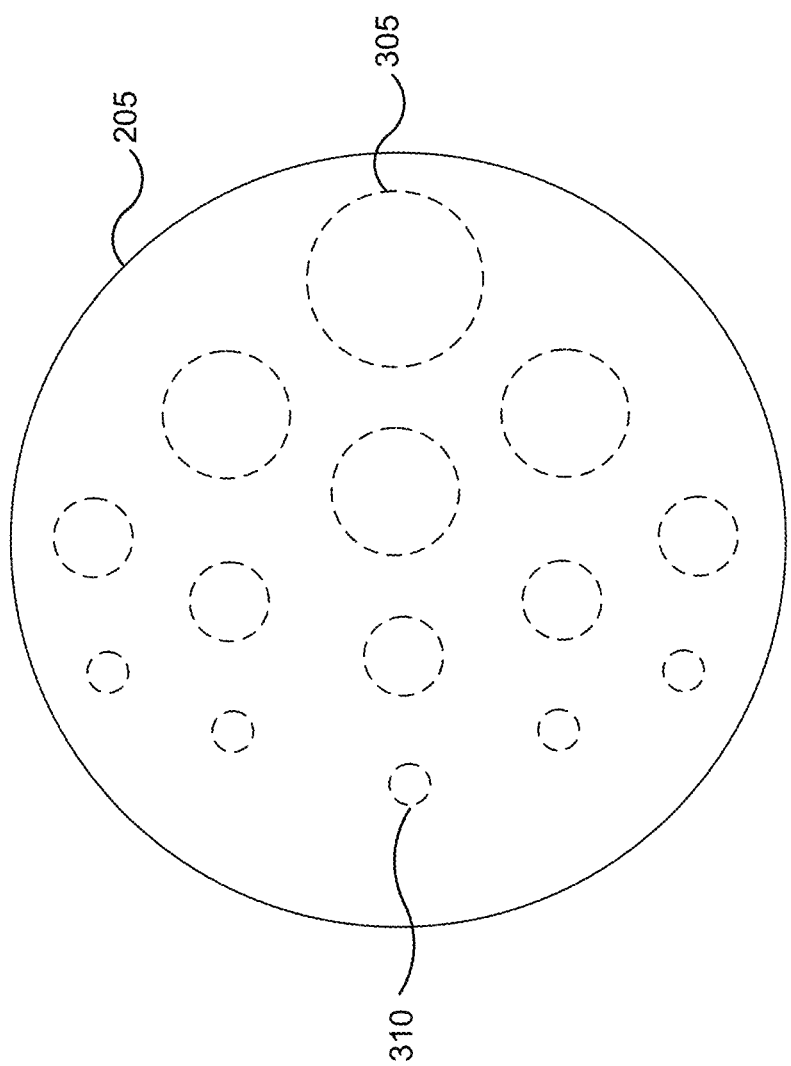
FIG. 3 shows a schematic representation of an example growth profile of example light emitters on an example substrate, in accordance with a non-limiting implementation of the present specification.

FIG. 3 shows a schematic representation of an example growth profile of nanorods on substrate 205. In the growth profile shown in FIG. 3, the dashed circles represent the amount of a given dopant available to, or incorporated into, the nanorods as a function of location of those nanorods on substrate 205. For simplicity and clarity of illustration, only two of the dashed circles 305 and 310 are labelled. The larger dashed circles represent a larger amount of the dopant incorporated or present in the nanorods at the corresponding locations on the substrate. For example, the dopant level corresponding to circle 305 is greater than the dopant level associated with circle 310, and the like. As shown in FIG. 3, the growth profile of the nanorods on substrate 205 is nonuniform. Such nonuniformity may be due to nonuniform dopant flows or fluxes across substrate 205 during the growth or formation of the nanorods. While the growth profile described in relation to FIG. 3 is related to dopant levels in the nanorod light emitters, it is contemplated that growth profiles in relation to other light emitter parameters may also be considered or used.

In some examples, the increased amount of dopant may also be correlated with relatively larger wavelengths of light emitted by the nanorods that comprise the relatively higher amounts of the dopant. As such, the growth profile shown in FIG. 3 also represents a profile or map of nonuniformity of the wavelengths of light emitted by the nanorods across substrate 205. A growth parameter of the nanorods may be adjusted in order to compensate for the growth profile nonuniformity shown in FIG. 3, in order to adjust or reduce the corresponding wavelength nonuniformity across substrate 205. In some examples, this growth parameter may be the diameter of the nanorods.

Figure 4:
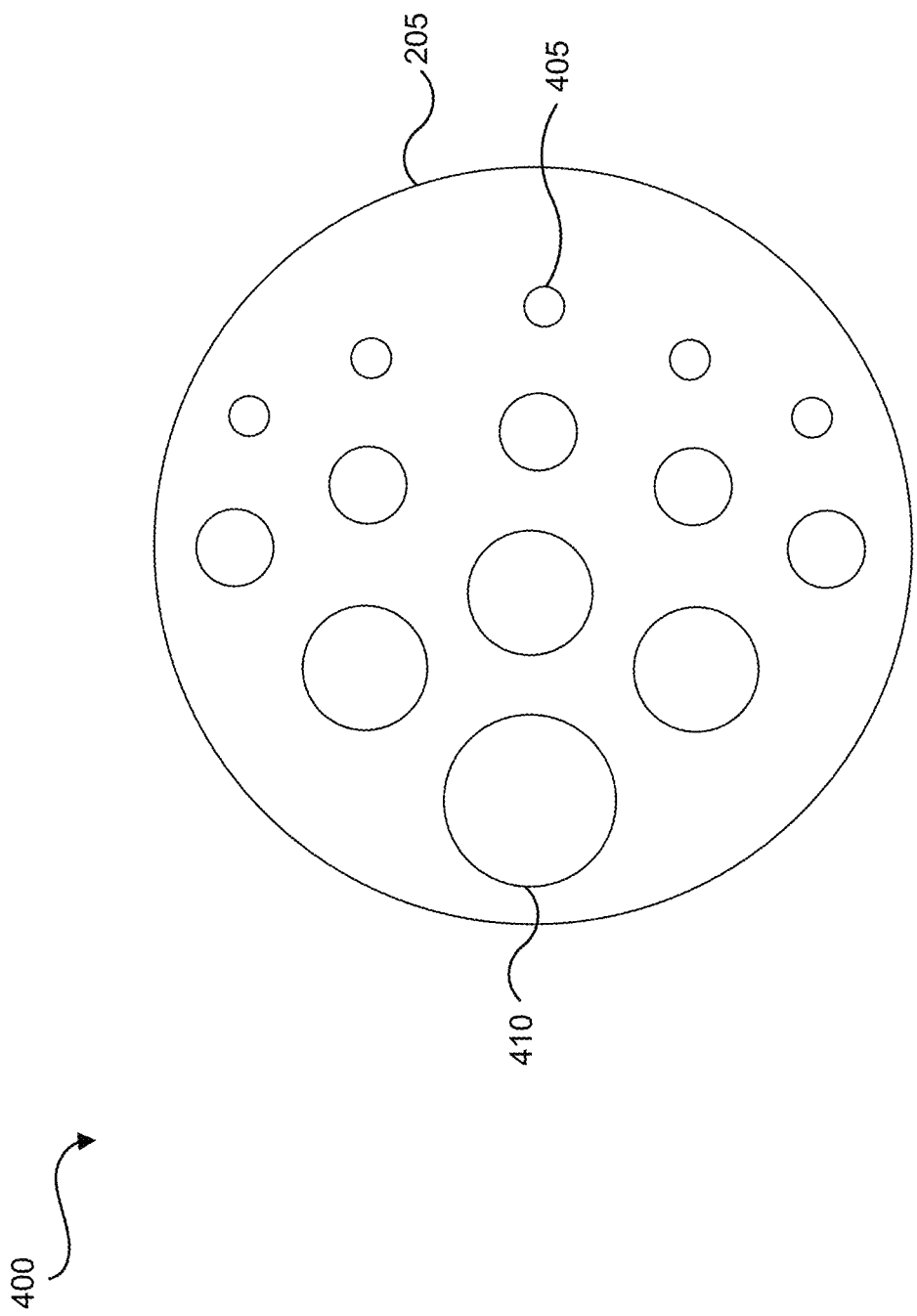
FIG. 4 shows a schematic top plan view of an example array of example nanorod light emitters grown on an example substrate, in accordance with a non-limiting implementation of the present specification.

FIG. 4 shows a schematic top plan view of an example array 400 of nanorod light emitters grown on substrate 205. FIG. 4 shows fourteen nanorods, but only example nanorods 410 and 415 are labelled for simplicity and clarity of illustration. In array 400, the diameter of the nanorods is adjusted to vary across substrate 205 as a function of the location of the nanorods. The diameters of the nanorods are chosen to compensate for the growth profile nonuniformity shown in FIG. 3. For example, in the location on the substrate corresponding to circle 305 where dopant levels and emission wavelengths were expected to be relatively high, the diameter of nanorod 405 is selected to be relatively small. A reduction in the diameter of a nanorod may increase quantum confinement in a quantum well present in the nanorod, thereby reducing the wavelength of the light emitted by the nanorod. In this manner, the growth parameter of the nanorod, e.g. its diameter, may be adjusted to a reduced diameter, which in turn shortens the wavelength of the light emitted by the nanorod to at least partially compensate for increases in the wavelength caused by nonuniform (i.e. higher) dopant levels affecting nanorod 405.

Similarly, diameter of nanorod 410 may be selected to be relatively larger to compensate for the relatively lower dopant levels as indicated by circle 310 in FIG. 3. Diameters of the other nanorods in array 400 may be selected or adjusted in a similar manner. While FIG. 3 shows a particular growth profile and FIG. 4 shows a corresponding adjusted growth parameter (e.g. nanorod diameters) to compensate for nonuniformity in that growth profile, it is contemplated that in some examples the growth profile may be different than that shown in FIG. 3, and that the corresponding adjusted growth parameters may be different as well.

Figure 5:
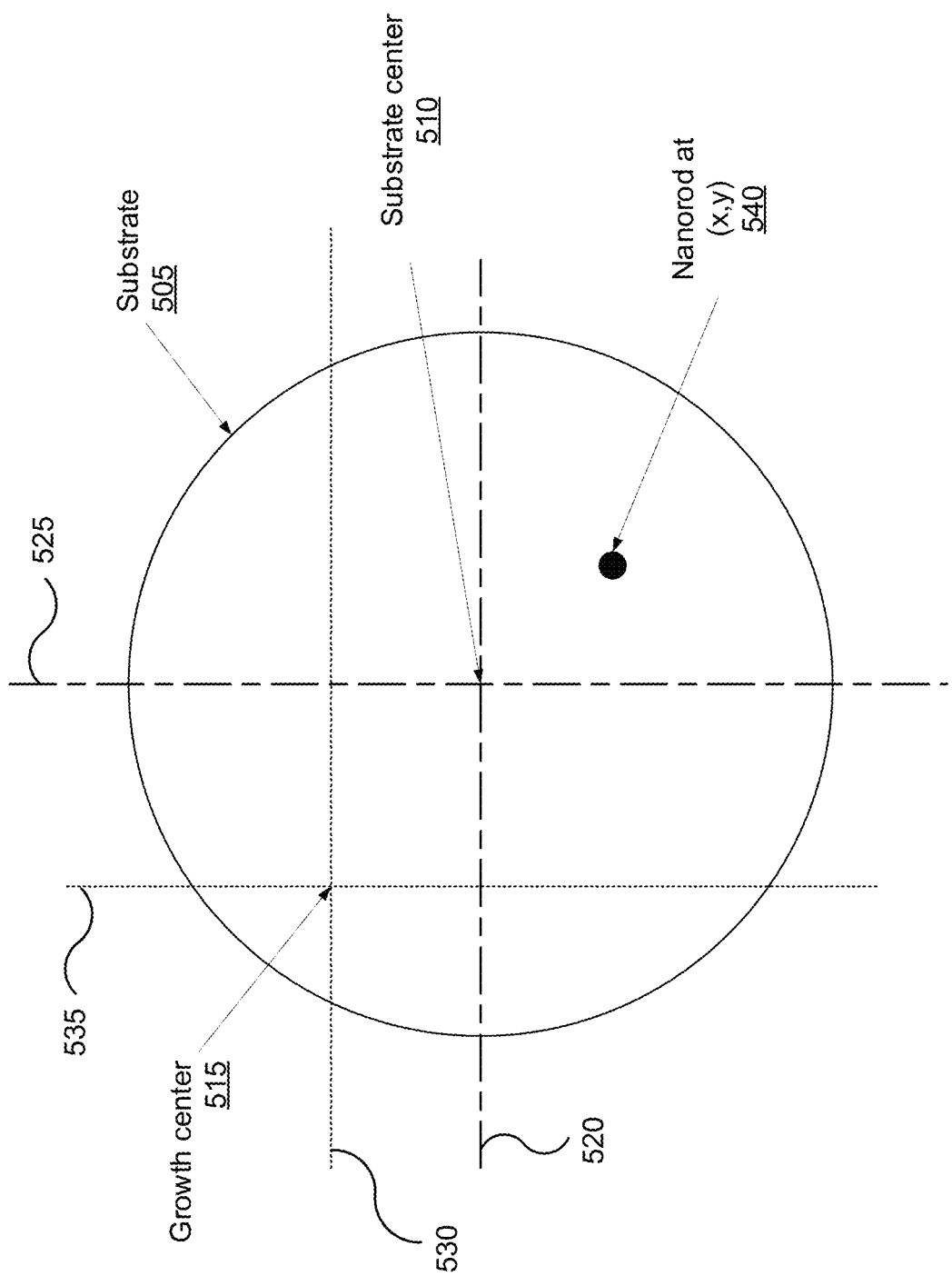
FIG. 5 shows a schematic top plan view of an example substrate on which an array of light emitters may be grown, in accordance with a non-limiting implementation of the present specification.

Turning now to FIG. 5, a schematic top plan view is shown of an example substrate 505, on which substrate 505 an array of light emitters may be grown. Substrate 505 may be similar to substrate 205. Substrate 505 may have a geometric substrate center 510. The growth profile of light emitters on substrate 505 may have a growth center 515. The illustration of substrate center 505 is aided by the use of axes 520 and 525, and the illustration of growth center 515 is aided by the use of axes 530 and 535. Axes 520, 525, 530, and 535 are shown for illustrative purposes only, and need not correspond a physical feature of substrate 505.

FIG. 5 shows that growth center 515 may be different than, or spaced from, substrate center 510. Moreover, while FIG. 5 shows a single growth center, it is contemplated that in some examples, the growth profile of the light emitters on substrate 505 may have a different growth center, or may have multiple growth centers. Each of these growth centers may represent a local or global minimum or maximum for one or more parameters associated with the growth of the light emitters on substrate 505. FIG. 5 also shows an example nanorod 540 grown at a position (x,y) on substrate 505. While one nanorod is shown in FIG. 5, it is contemplated that additional nanoroads may also be grown on, or present on, substrate 505 as part of an array of light emitters grown on substrate 505.

Figure 6:
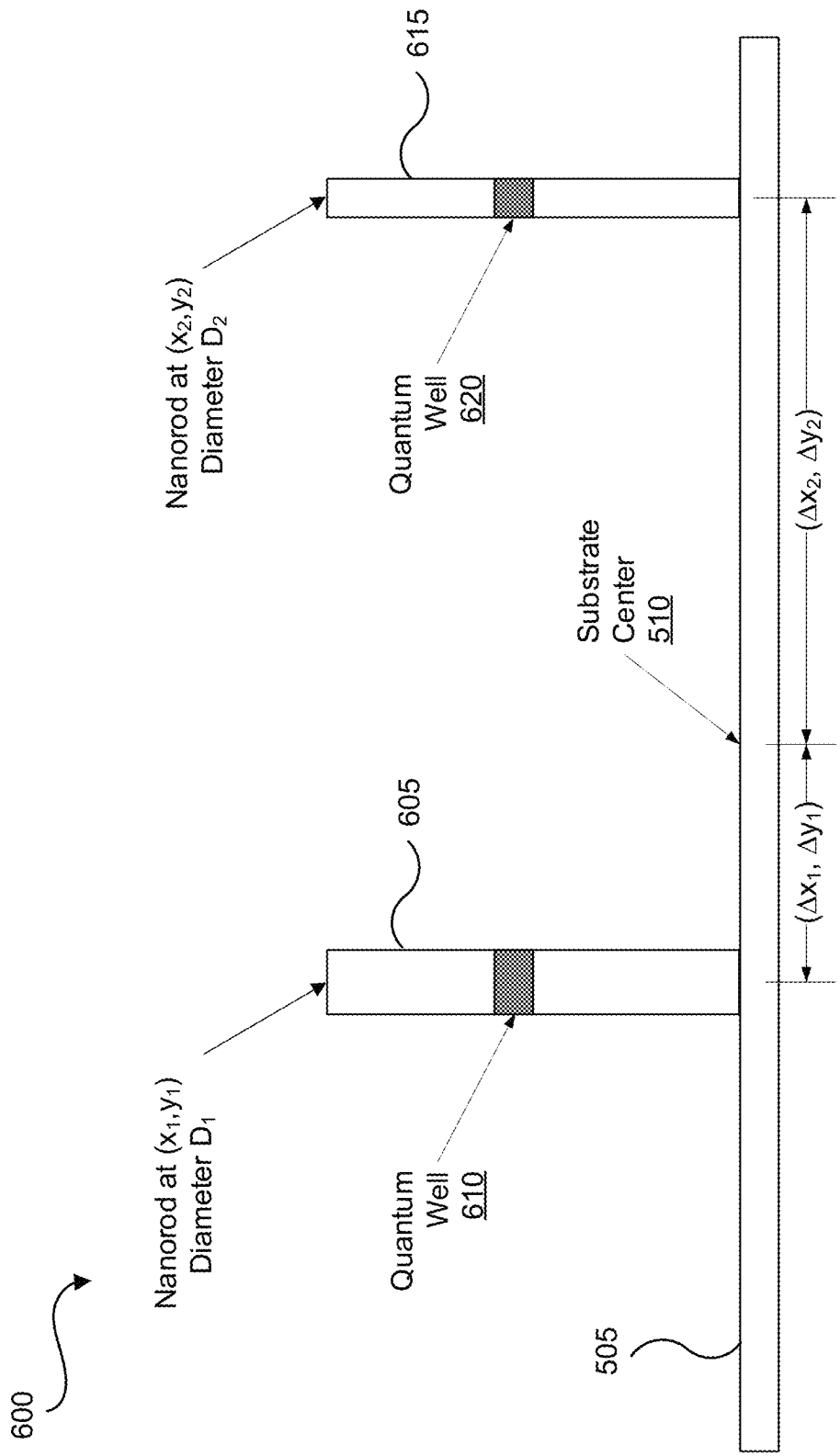
FIG. 6 shows a partial, schematic, side elevation view of an example array of example nanorods on an example substrate, in accordance with a non-limiting implementation of the present specification.

FIG. 6 shows a partial, schematic, side elevation view of an example array 600 of nanorods on substrate 505. While FIG. 6 shows two nanorods 605 and 615, it is contemplated that array 600 may comprise more than two nanorods. Nanorod 605 is located at a first location (x1,y1) on substrate 505 and has a diameter D1. Nanorod 605 also comprises a quantum well 610. It is contemplated that in some examples, the size, number, or location of the quantum well(s) in nanorod 605 may be different than those shown in FIG. 6. For example, it is contemplated that in some examples the nanorod may be grown or formed, and then the quantum well may be formed on a portion of, or all of, the surface of the nanorod. Moreover, in some examples, such a formation of the quantum well on the surface of the nanorod may produce a core-shell nanorod structure, or other suitable structures. Referring back to FIG. 6, diameter D1 of nanorod 605 impacts the degree of quantum confinement in quantum well 610, thereby affecting the wavelength of light emitted by nanorod 605.

Array 600 also comprises nanorod 615, which is located at a second location (x2,y2) on substrate 505 and has a diameter D2. Nanorod 615 also comprises a quantum well 620. It is contemplated that in some examples, the size, number, or location of the quantum well(s) in nanorod 615 may be different than those shown in FIG. 6. Diameter D2 impacts the degree of quantum confinement in quantum well 620, thereby affecting the wavelength of light emitted by nanorod 615. As shown in FIG. 6, diameter D1 of nanorod 605 is different than diameter D2 of nanorod 615. This difference may compensate for nonuniformity in the growth profile of nanorods on substrate 505 and reduce a corresponding wavelength nonuniformity between the light emitted by nanorod 605 and the light emitted by nanorod 615.

Diameters of nanorods 605 and 615 represent examples of a parameter of those nanorods. Nanorods, or light emitters generally, may have other parameters also, which may relate to sizes, shapes, compositions, or other attributes of those light emitters. In some examples, a parameter of a light emitter may be associated with a corresponding growth parameter during the growth of that light emitter.

Array 600 is an example of a device comprising a substrate and an array of light emitters grown on the substrate. The arrays shown in FIGS. 4, 7, 10, and 12 may provide other examines of such devices. In such devices the array may comprise a first light emitter and a second light emitter. In some examples, the array may also comprise additional light emitters. The first light emitter may be located at a first location on the substrate and have a first parameter. The first light emitter may emit a first light having a first wavelength, and the first parameter may be associated with the first wavelength. Similarly, the second light emitter may be located at a second location on the substrate and may have a second parameter. The second light emitter may emit a second light having a second wavelength, and the second parameter may be associated with the second wavelength.

The first parameter may be different from the second parameter to compensate for nonuniformity in a growth profile of the light emitters across the substrate. This nonuniformity may be associated with a corresponding nonuniformity between the first wavelength and the second wavelength. The first parameter and the second parameter may be selected to reduce the corresponding nonuniformity.

Figure 7:
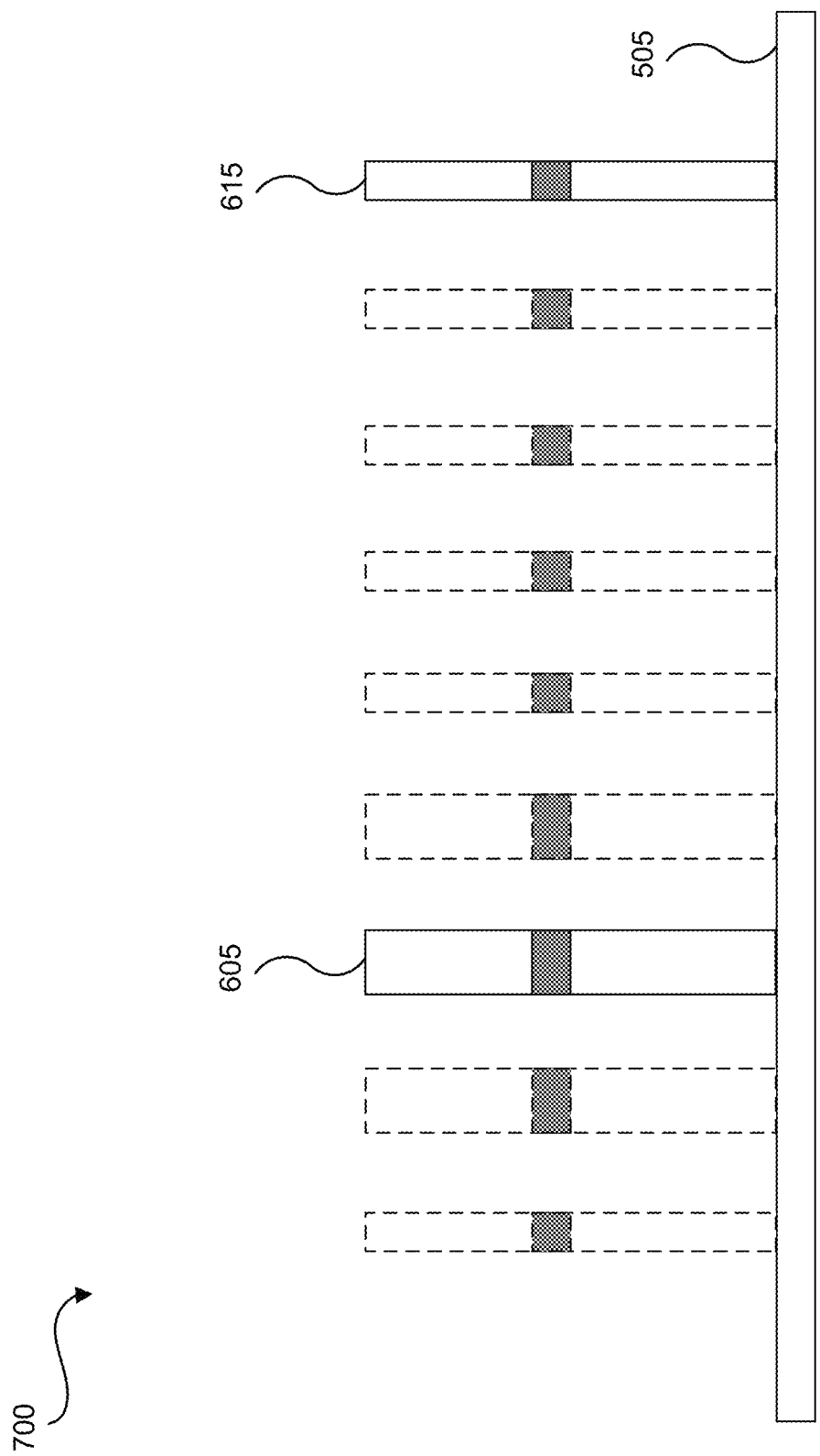
FIG. 7 shows a schematic side elevation view of an example array of example nanorod light emitters on an example substrate, in accordance with a non-limiting implementation of the present specification.

FIG. 7 shows a schematic side elevation view of an example array 700 of nanorod light emitters on substrate 505. Array 700 may be similar to array 600, with a difference being that array 700 may comprise nanorods in addition to nanorods 605 and 615. These nanorods may have different diameters to compensate for nonuniformity in the growth profile of the nanorods across substrate 505.

In example arrays and devices that use nanorods as the active light emitting components, substrates other than III-V semiconductor wafers may be used. This allows, for example, commercially available Si wafers as large as 300 mm to be used. However, nonuniform growth profiles and the resulting light emission variability across the wafer may become larger, potentially exacerbating low yield issues.

By making the arrays and devices using nanorods or nanowalls, a new process control variable based on the size of the light emitter is introduced, namely the geometry of the nanorods or nanowalls. For various nanorod/nanowall geometries, e.g. core-shell and conventional quantum well (QW) cross sections, the geometry of the nanorods/nanowalls influences the emission wavelength of the QW. An example is the nanorod diameter, where in one example, the nanorod diameter at a given location on the substrate is defined by the diameter of an opening in a mask at that location, and therefore may be individually defined. In some examples, the mask may comprise a metal mask, and the like. Similar control may be exerted on the thickness of a nanowall to control the light emission wavelength of that nanowall.

This control variable may be used across the substrate (e.g. wafer) to compensate for actual growth conditions. As an example, adjusting nanorod diameter as a function of distance along the radius from the location of a central growth value. Note that there may be an offset from this central growth value and the center of the wafer. For example, the growth conditions result in emission wavelength distributions that are Gaussian in x and y, with an offset from the substrate center of ☐x, ☐y. In addition, the pattern need not be uniform: local hotspots may also be mapped out for a given machine or set of growth conditions, and then compensated. The same approach may be used to map out a different result for a different set of growth conditions or nanorods grouped by wavelength on a single substrate, such as Red, Green and Blue emitters arranged in a display.

In some examples, the growth center may represent either the peak or minimum value of any light emitter parameter such as fluorescence wavelength and need not be symmetric, or even single valued. Multiple peaks, local peaks, or hot spots may all be accounted for. In FIG. 5 an exemplary nanorod is shown as round, but the actual shape may depend on many factors, including growth conditions, material and dopant levels, and the like.

In some examples, nanorods may be grown on a substrate, where the diameter or height of the nanorods is varied as a function of location on the substrate. Moreover, in some examples nanorods may be grouped in different emission wavelengths, where the diameter or height of the nanorod varies for each group of emission wavelengths as a function of location on the substrate.

Figure 8:
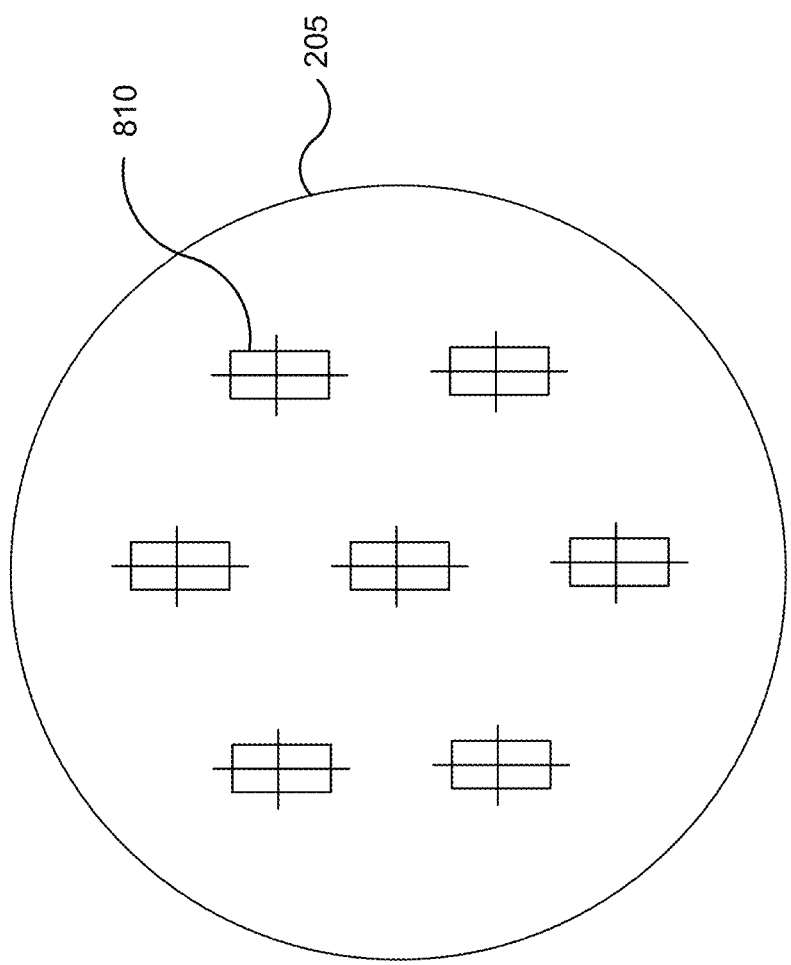
FIG. 8 shows a schematic top plan view of an example substrate for an array of light emitters, in accordance with a non-limiting implementation of the present specification.

Turning now to FIG. 8, a schematic top plan view is shown of example substrate 205 for an array of light emitters. Position markers 810 show example locations of light emitters on substrate 205. FIG. 8 is similar to FIG. 2, with a difference being that position markers 810 mark positions of nanowall light emitters. A nanowall may describe a structure grown on substrate 205 which may be quantum-confined in one dimension, namely in the dimension of the width or thickness of the nanowall. As such, adjusting the wall thickness of the nanowalls may allow for adjusting the wavelength of the light emitted by the nanowall light emitters.

Figure 9:
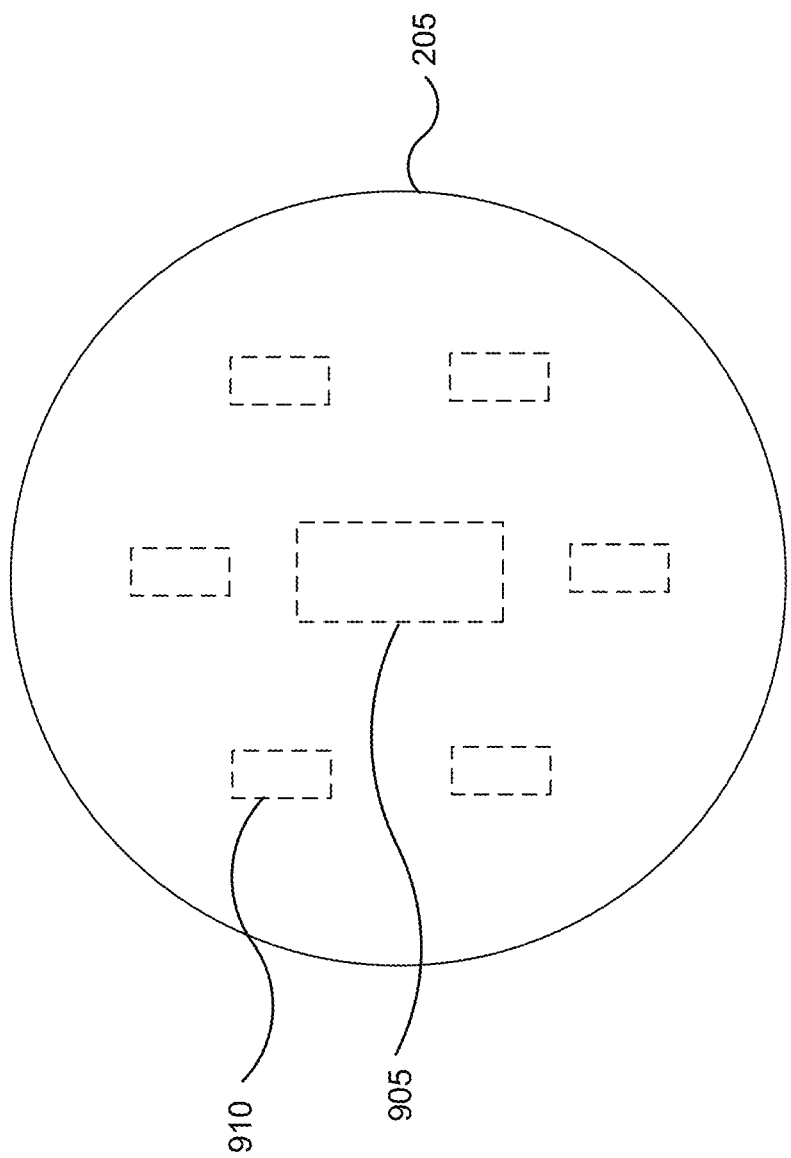
FIG. 9 shows a schematic representation of an example growth profile of example nanowalls on an example substrate, in accordance with a non-limiting implementation of the present specification.

FIG. 9 shows a schematic representation of an example growth profile of the nanowalls on substrate 205. Larger dashed rectangles represent higher dopant levels, which may correspond to a longer wavelength emitted by the nanowall light emitters. For example, rectangle 905 may represent relatively higher dopant levels nearer the center of substrate 205, while rectangle 910 may represent relatively lower dopant levels further from the center of substrate 205. These dopant levels may refer to the dopant levels present during the growth of the nanowalls, and therefore the level or amount of dopants incorporated into the nanowalls during their growth on substrate 205.

Figure 10:
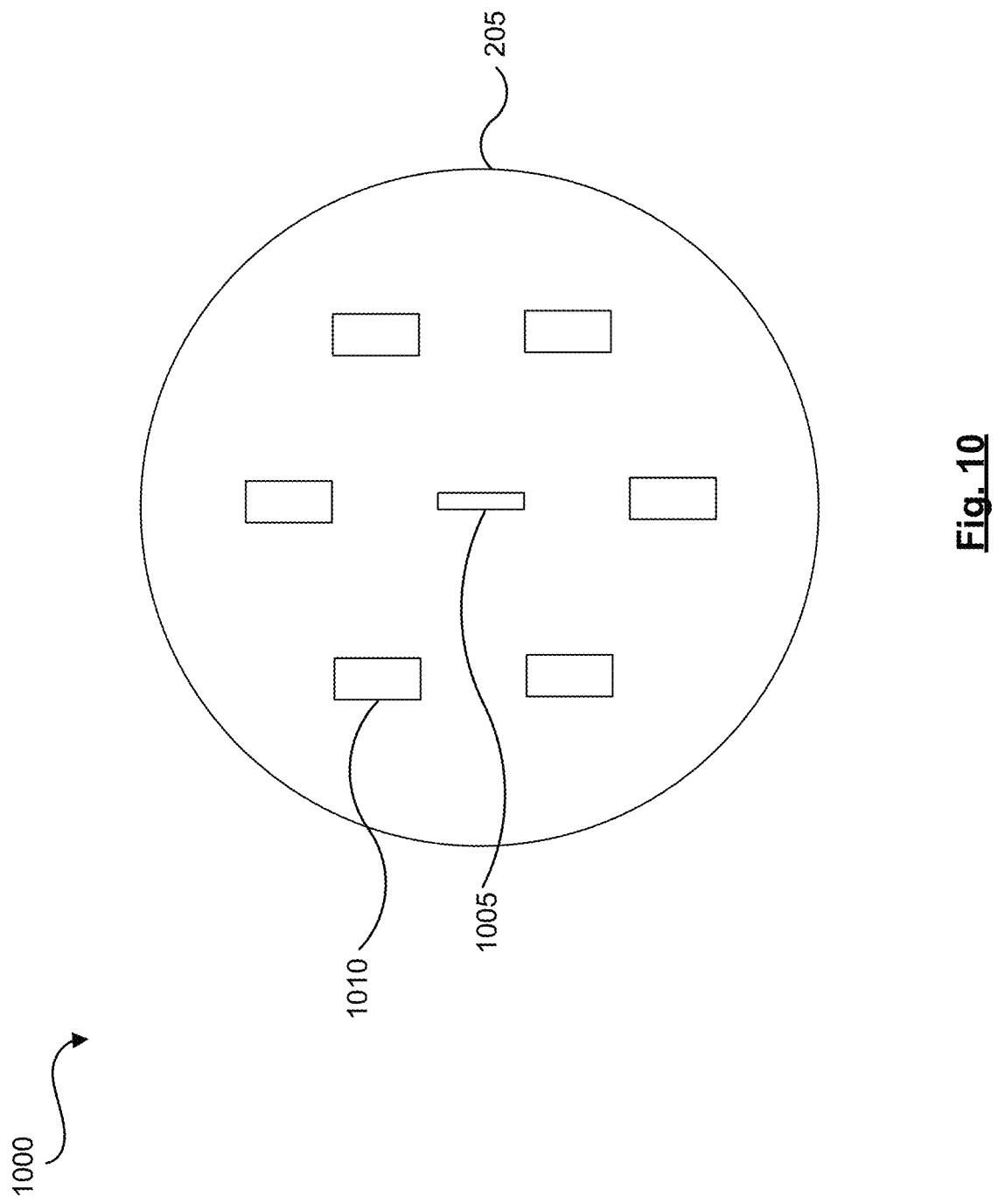
FIG. 10 shows a schematic top plan view of an example array of example nanowall light emitters grown on an example substrate, in accordance with a non-limiting implementation of the present specification.

FIG. 10, in turn, shows a schematic top plan view of an example array 1000 of nanowall light emitters grown on substrate 205. FIG. 10 shows seven nanowalls, but only example nanowalls 1005 and 1010 are labelled for simplicity and clarity of illustration. In array 1000, the thickness of the nanowalls is varied across substrate 205 as a function of the location of the nanowalls. The thicknesses of the nanowalls are chosen to compensate for the growth profile non-uniformity shown in FIG. 9. For example, in the location on the substrate corresponding to rectangle 905 where dopant levels and emission wavelengths were expected to be relatively high, the thickness of nanowall 1005 is selected to be relatively smaller. A reduction in the thickness of the nanowall may increase quantum confinement in a quantum well present in the nanowall, thereby reducing the wavelength of the light emitted by the nanowall. In this manner, the growth parameter of the nanowall, e.g. its thickness, may be adjusted to a reduced thickness, which in turn shortens the wavelength of the light emitted by the nanowalls to at least partially compensate for increases in the wavelength caused by nonuniform (i.e. higher) dopant levels affecting nanowall 1005.

Similarly, thickness of nanowall 1010 may be selected to be relatively larger to compensate for the relatively lower dopant levels as indicated by rectangle 910 in FIG. 9. Thicknesses of the other nanowalls in array 1000 may be selected or adjusted in a similar manner. While FIG. 9 shows a particular growth profile and FIG. 10 shows corresponding adjusted growth parameters (e.g. nanowall thicknesses) to compensate for nonuniformity in that growth profile, it is contemplated that in some examples the growth profile may be different than that shown in FIG. 9, and that the corresponding adjusted growth parameters may be different as well.

Figure 11:
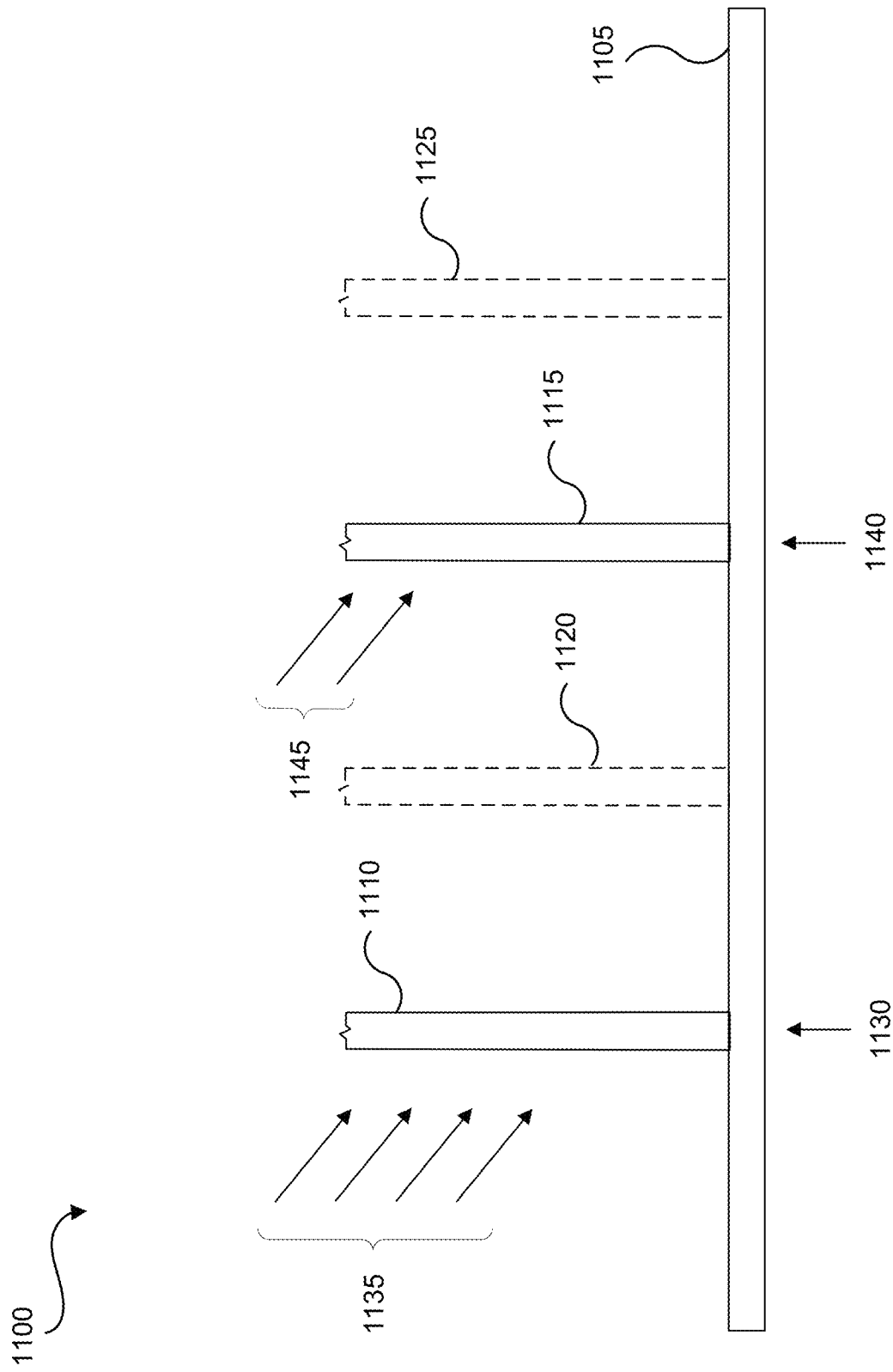
FIG. 11 shows a schematic side elevation view of an example array of example light emitters being grown on an example substrate, in accordance with a non-limiting implementation of the present specification.

FIG. 11 shows a schematic side elevation view of an example array 1100 of light emitters being grown on a substrate 1105. Substrate 1105 may be similar to substrates 205 or 505. Array 1100 comprises light emitters 1110 and 1115. In some examples, array 1100 may also comprise additional light emitters 1120 and 1125. The top of light emitters 1110, 1115, 1120, and 1125 is shown using jagged lines to indicate that these light emitters are shown in the process of being grown on substrate 1105. As these light emitters are in the process of being grown, then may be subject to further change in their size, shape, composition, or other attributes.

Moreover, light emitters 1110, 1115, 1120, and 1125 may comprise nanorods, nanowalls, or other light emitters. As shown in FIG. 11, light emitter 1110 is located at location 1130 on substrate 1105. Flow rate or flux of a constituent material of light emitter 1110 is represented by flux 1135. Examples of such a constituent material may include a dopant or other constituent of light emitter 1110. Light emitter is located at location 1140 on substrate 1105. Flow rate or flux of a constituent material of light emitter 1115 is represented by flux 1145. As shown in FIG. 11, flux 1135 is greater than flux 1145. This difference between fluxes 1135 and 1145 may represent a nonuniformity in the growing conditions and the growth profile of light emitters 1110 and 1115 based on their respective locations across substrate 1105. While in FIG. 11 fluxes are not shown for light emitters 1120 and 1125, it is contemplated that fluxes corresponding to emitters 1120 and 1125 may be similar to or different from fluxes 1135 and 1145.

In order to compensate for the nonuniformity in the growth conditions and growth profile of the light emitters across substrate 1105, in some examples a structure may be grown or otherwise added to the substrate proximate one or more of the light emitters to at least partially shadow the deposition of the corresponding light emitters. FIG. 12 shows an example of such a structure.

FIG. 12 shows a schematic side elevation view of an example array 1200 of light emitters being grown on substrate 1105. Array 1200 may be similar to array 1100, with a difference being that in array 1200 a structure 1205 is grown or otherwise added to substrate 1105 proximate light emitter 1210. Structure 1205 shadows or blocks a first portion 1215 of the flux of constituent materials from reaching light emitter 1210, while allowing a second portion 1220 of the flux to reach light emitter 1210. Second portion 1220 may be substantially similar to flux 1145. In this manner, structure 1205 may be used to reduce the nonuniformity between the flux of materials reaching light emitters 1210 and 1115, thereby compensating for the nonuniformity in the growth profile across substrate 1105.

In FIG. 12, structure 1205 may be used to adjust the composition of light emitter 1210 by adjusting the flux of constituent materials that reaches light emitter 1210. In some examples, such shadowing structures may also be used to adjust other parameters of light emitters such as their size, shape, structure, constituent material distribution, and the like. In addition, while FIG. 12 shows structure 1205 as being a rectangular barrier smaller than its corresponding light emitter 1210, it is contemplated that in some examples the shadowing structure may be a shape, size, or structure other than the one shown in FIG. 12. For example, the array may comprise: more than one shadowing structure, a shadowing structure that shadows more than one corresponding light emitter, and the like.

In addition, in some examples, the shadowing structure need not be spaced from its corresponding light emitter. In such examples, the shadowing structure may be abutting its corresponding light emitter, or may be a partial or full cladding, coating, or other covering on its corresponding light emitter. Some shadowing effects are described in Sekiguchi, H. et al. "Emission color control from blue to red with nanocolumn diameter of lnGaN/GaN nanocolumn arrays grown on same substrate", APPLIED PHYSICS LETTERS 96, 231104 (2010), which is incorporated herein by reference in its entirety.

In other words, in some example devices, a first parameter may comprise a first composition of a first light emitter and a second parameter may comprise a second composition of a second light emitter of an array of light emitters. The device may further comprise a structure on the substrate proximate the first light emitter to at last partially shadow depositing the first light emitter on the substrate to adjust the first composition of the first light emitter relative to the second composition of the second light emitter.

The foregoing describes growing or depositing light emitters or shadowing structures on a substrate. It is contemplated that in some examples such a growing of light emitters or shadowing structures on a substrate need not be limited to methods of additive fabrication where material is added to or deposited onto the substrate. For example, it is contemplated that growing light emitters or shadowing structures on the substrate may include selectively etching the substrate to form quantum wells, light emitting structures such as nanorods, nanowalls, and the like, or shadowing structures. In some examples, this type of etching may be performed using a mask having openings. Selecting the shape or size of the openings in the mask may allow for adjusting parameters of the light emitters or shadowing structures formed using the mask.

Throughout this specification and the appended claims, infinitive verb forms are often used. Examples include, without limitation: "to obtain," "to compensate," "to adjust," "to emit," and the like. Unless the specific context requires otherwise, such infinitive verb forms are used in an open, inclusive sense, that is as "to, at least, obtain," to, at least, compensate," "to, at least, adjust," and so on.

The above description of illustrated example implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. Moreover, the various example implementations described herein may be combined to provide further implementations.

In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method of growing an array of light emitters on a substrate, the method comprising:
   obtaining a growth profile of the light emitters across the substrate;
   determining a nonuniformity in the growth profile across the substrate;
   adjusting a growth parameter of a given light emitter of the array of the light emitters to obtain an adjusted growth parameter, the adjusting based on a location of the given light emitter on the substrate, the adjusting to compensate for the nonuniformity in the growth profile of the light emitters across the substrate, the nonuniformity associated with a corresponding nonuniformity among wavelengths of light generated by the light emitters, the adjusting the growth parameter to adjust the corresponding nonuniformity; and
   growing the given light emitter on the substrate based on the adjusted growth parameter.

2. The method of claim 1, wherein the light emitters comprise solid-state light emitters each comprising a corresponding quantum well to emit light.

3. The method of claim 2, wherein one or more of the light emitters comprise a nanorod or a nanowall.

4. The method of claim 1, wherein the growth parameter comprises one or more of a size, shape, and composition of the given light emitter.

5. The method of claim 4, wherein:
   the given light emitter comprises a nanorod; and
   the growth parameter comprises a diameter of the nanorod.

6. The method of claim 5, wherein:
   the adjusting the growth parameter comprises adjusting a corresponding diameter of an opening in a mask; and
   the growing the nanorod comprises depositing the nanorod on the substrate through the opening in the mask.

7. The method of claim 1, wherein the growing the given light emitter comprises depositing the given light emitter on the substrate using one or more of molecular beam epitaxy (MBE), chemical vapor deposition (CVD), and liquid phase epitaxy (LPE).

8. The method of claim 1, wherein the adjusting the growth parameter is to reduce the corresponding nonuniformity.

9. A method of growing an array of light emitters on a substrate, the method comprising:
   adjusting a growth parameter of a given light emitter of the array of the light emitters to obtain an adjusted growth parameter, the adjusting based on a location of the given light emitter on the substrate, the adjusting to compensate for nonuniformity in a growth profile of the light emitters across the substrate, the nonuniformity associated with a corresponding nonuniformity among wavelengths of light generated by the light emitters, the adjusting the growth parameter to adjust the corresponding nonuniformity; and
   growing the given light emitter on the substrate based on the adjusted growth parameter;
   wherein:
   the growth parameter comprises the composition of the given light emitter;
   the growing the given light emitter comprises depositing the given light emitter on the substrate; and
   the adjusting the growth parameter comprises forming a structure on the substrate proximate the given light emitter to at last partially shadow the depositing the given light emitter to adjust the composition of the given light emitter.

10. A device comprising:
    a substrate;
    an array of light emitters grown on the substrate, the array comprising:
    a first light emitter located at a first location on the substrate and having a first parameter, the first light emitter to emit a first light having a first wavelength, the first parameter associated with the first wavelength; and
    a second light emitter located at a second location on the substrate and having a second parameter, the second light emitter to emit a second light having a second wavelength, the second parameter associated with the second wavelength; and the first parameter being different from the second parameter to compensate for nonuniformity in a growth profile of the light emitters across the substrate, the nonuniformity associated with a corresponding nonuniformity between the first wavelength and the second wavelength, the first parameter and the second parameter selected to reduce the corresponding nonuniformity;

wherein:
- the first parameter comprises a first composition of the first light emitter and the second parameter comprises a second composition of the second light emitter; and
- the device further comprises a structure on the substrate proximate the first light emitter to at last partially shadow depositing the first light emitter on the substrate to adjust the first composition of the first light emitter relative to the second composition of the second light emitter.

11. The device of claim 10, wherein the light emitters each comprise a solid-state light emitter having a quantum well to emit light.

12. The device of claim 11, wherein one or more of the light emitters comprise a nanorod or a nanowall.

13. The device of claim 10, wherein the first parameter and the second parameter each further comprises one or more of a size and shape of the first light emitter and the second light emitter respectively.

14. The device of claim 13, wherein one or more of:
- the first light emitter comprises a first nanorod and the second light emitter comprises a second nanorod; and
- the first parameter further comprises a diameter of the first nanorod and the second parameter further comprises a corresponding diameter of the second nanorod.

* * * * *